(12) United States Patent
Van De Kerkhof

(10) Patent No.: US 10,935,673 B2
(45) Date of Patent: Mar. 2, 2021

(54) RADIATION ANALYSIS SYSTEM

(71) Applicant: ASML Netherlands B.V., Veldhoven (NL)

(72) Inventor: Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 86 days.

(21) Appl. No.: 16/344,661

(22) PCT Filed: Oct. 2, 2017

(86) PCT No.: PCT/EP2017/075002
§ 371 (c)(1),
(2) Date: Apr. 24, 2019

(87) PCT Pub. No.: WO2018/091189
PCT Pub. Date: May 24, 2018

(65) Prior Publication Data
US 2020/0057166 A1    Feb. 20, 2020

(30) Foreign Application Priority Data

Nov. 15, 2016   (EP) .................................... 16198840

(51) Int. Cl.
*G01T 1/16* (2006.01)
*G01K 5/48* (2006.01)
(Continued)

(52) U.S. Cl.
CPC .............. *G01T 1/1606* (2013.01); *G01K 5/48* (2013.01); *G01K 17/003* (2013.01); *G03F 7/7085* (2013.01)

(58) Field of Classification Search
CPC ....... G01T 1/1606; G01K 5/48; G01K 17/003
See application file for complete search history.

(56) References Cited

U.S. PATENT DOCUMENTS 5,316,380 A   5/1994  Secemski
5,325,180 A   6/1994  Chappelow et al.
(Continued)

FOREIGN PATENT DOCUMENTS

CN   1677246 A    10/2005
CN   101495939 A    7/2009
(Continued)

OTHER PUBLICATIONS

International Search Report and Written Opinion of the International Searching Authority directed to related International Patent Application No. PCT/EP2017/075002, dated Jun. 29, 2018; 8 pages.

*Primary Examiner* — Edwin C Gunberg
(74) *Attorney, Agent, or Firm* — Sterne, Kessler, Goldstein & Fox P.L.L.C.

(57) ABSTRACT

A radiation analysis system comprising a target comprising two marks which are separated from each other, the target being configured to undergo thermal expansion when illuminated with radiation; a position measurement system configured to measure a change in the separation of the marks; and a processor configured to determine a power of the radiation using the measured change in separation of the marks.

30 Claims, 10 Drawing Sheets

(51) Int. Cl.
*G01K 17/00* (2006.01)
*G03F 7/20* (2006.01)

(56) References Cited

U.S. PATENT DOCUMENTS

| | | |
|---|---|---|
| 5,892,237 A * | 4/1999 | Kawakami ............ B82Y 10/00 |
| | | 250/492.22 |
| 6,297,876 B1 | 10/2001 | Bornebroek |
| 6,961,116 B2 | 11/2005 | Den Boef et al. |
| 7,417,748 B2 | 8/2008 | Fox et al. |
| 8,436,984 B2 | 5/2013 | Van Weert et al. |
| 8,502,954 B2 | 8/2013 | Van Der Feltz et al. |
| 2005/0179898 A1 | 8/2005 | Mishima |

FOREIGN PATENT DOCUMENTS

| | | |
|---|---|---|
| CN | 101750907 A | 6/2010 |
| WO | WO 2015/185269 A1 | 12/2015 |
| WO | WO 2018/091189 A2 | 5/2018 |

* cited by examiner

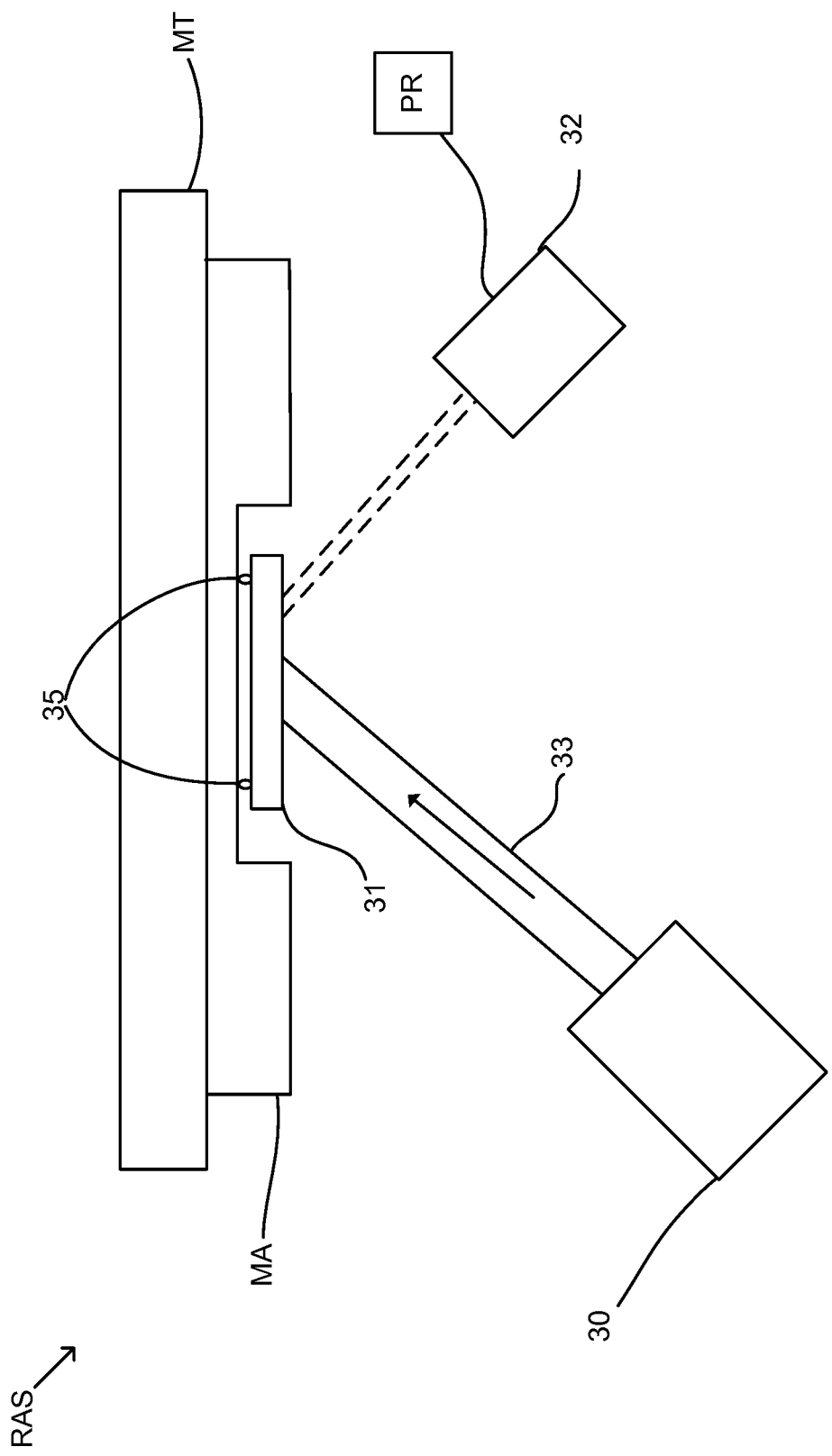

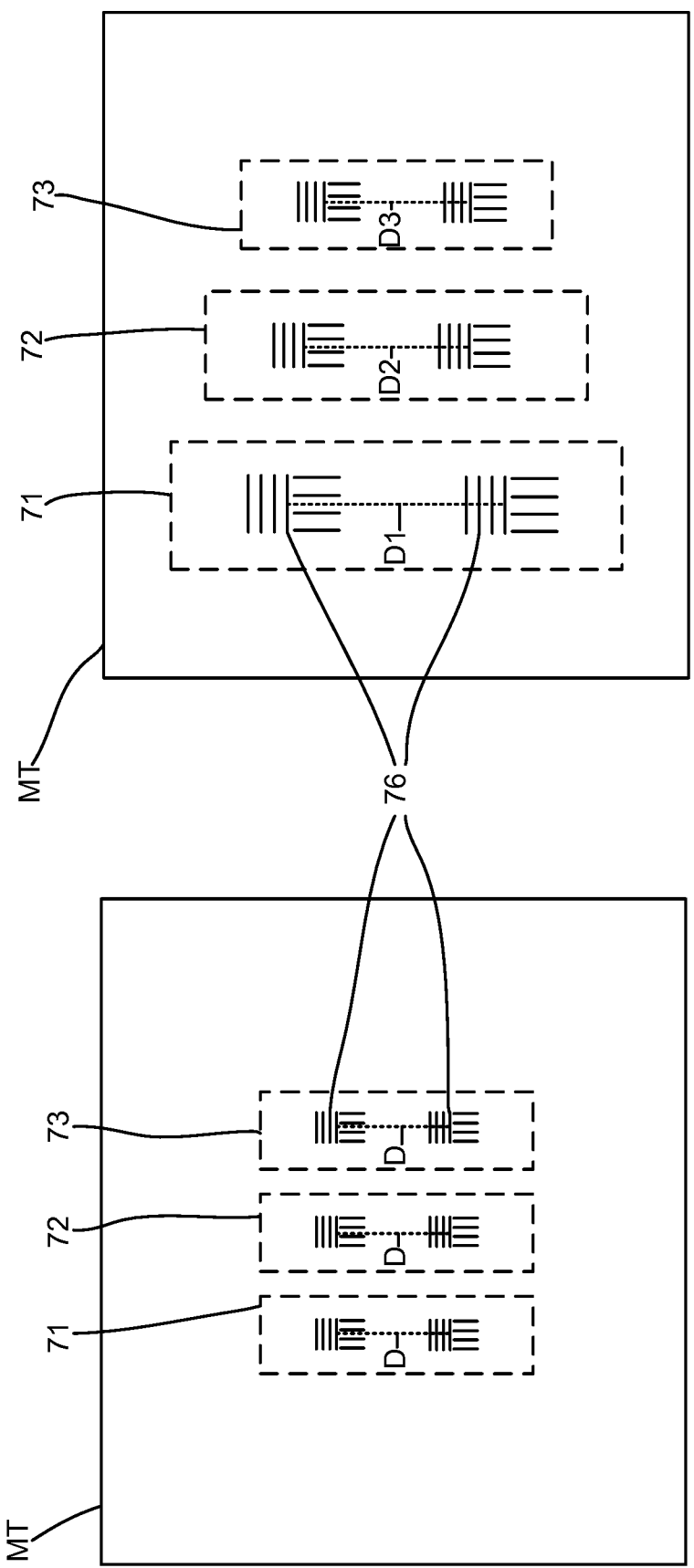

RADIATION ANALYSIS SYSTEM

CROSS-REFERENCE TO RELATED APPLICATIONS

This application claims priority of EP application number 16198840.7, which was filed on 15 Nov. 2016 and which is incorporated herein its entirety by reference.

FIELD

The present invention relates to a radiation analysis system and method. The radiation analysis system may form part of a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

It is beneficial to know the power of radiation present in a lithographic apparatus to a high degree of accuracy. For example, the patterning device may be protected from contamination by a transparent film known as a pellicle. The pellicle may become damaged and inoperative when exposed to radiative power that exceeds a threshold value. It may be advantageous to accurately measure the power of radiation in the region of the patterning device so that the radiative power can be kept below the threshold level and the pellicle does not become damaged.

It is an object of the invention to provide a system and method of determining the radiative power present in a lithographic apparatus which at least partially addresses one or more of the problems of the prior art, whether identified herein or elsewhere.

SUMMARY

According to a first aspect of the invention, there is provided a radiation analysis system comprising a target comprising two marks which are separated from each other, the target being configured to undergo thermal expansion when illuminated with radiation, a position measurement system configured to measure a change in the separation of the marks, and a processor configured to determine a power of the radiation using the measured change in separation of the marks.

The radiation analysis system advantageously provides an accurate measurement of radiative power. The radiation analysis system may be used to provide accurate, in-situ, passive measurements in apparatus such as, for example, a lithographic apparatus.

The target may be thermally isolated from its surroundings.

Thermally isolating the target advantageously limits heat transfer between the target and its surroundings, thereby increasing the accuracy of the radiation analysis system.

The target may be in a vacuum environment.

Providing the target in a vacuum environment advantageously reduces heat transfer from the target to its surroundings via convection, thereby increasing the accuracy of the radiation analysis system.

The target may comprise a measurement plate.

The measurement plate may comprise a metal or a semiconductor.

The target may be one of multiple targets having different radiation absorption properties.

Using multiple targets having different radiation absorption properties advantageously allows different wavelengths of radiation to be analyzed by the radiation analysis system.

Different targets may comprise different coatings having different radiation absorption properties.

Applying different coatings to different targets is a simple way of allowing different wavelengths of radiation to be analyzed by the radiation analysis system.

The separation between the marks may be between 20 mm and 110 mm.

An initial separation of between 20 mm and 110 mm is large enough to enable accurate position measurements of the marks to be made whilst still allowing the marks to fit within an exposure slit of a lithographic apparatus.

A coefficient of thermal expansion of the target may be within the inclusive range of 2 ppm $K^{-1}$ to 30 ppm $K^{-1}$.

A specific heat capacity of the target may be within the inclusive range of 1 J $cm^{-3}K^{-1}$ to 3 J $cm^{-3}K^{-1}$.

A thickness of the target may be in the inclusive range of 0.1 mm to 1.0 mm.

The radiation analysis system may form part of a lithographic apparatus, the lithographic apparatus comprising an illumination system configured to condition a radiation beam, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto the substrate, wherein the radiation analysis system may be configured to analyse the radiation beam.

Having the radiation analysis system as part of a lithographic apparatus allows accurate, in-situ measurements of a radiation beam to be performed. The lithographic apparatus may already have a position measurement system and/or targets that are capable of forming part of the radiation analysis system, thereby allowing an inexpensive way of analyzing a radiation beam that is easily retrofitted to existing lithographic apparatus.

The target may be a measurement substrate.

Substrates are extensively used in lithographic apparatus. Using a measurement substrate as a target therefore allows the radiation analysis system to be easily retrofitted to existing lithographic apparatus.

The measurement substrate may be mounted on the substrate table and supported by burls, the burls forming a burl area across the measurement substrate, wherein the marks may be located outside of the burl area.

Thermal expansion of the measurement substrate may be limited by the presence of burls within a burl area. Locating the marks outside of the burl area advantageously allows the separation between the marks to expand more freely, which increases the accuracy of the radiation analysis system by reducing the consideration of potentially complicating restoring forces provided by the burls when determining a power of the radiation.

The measurement substrate may be mounted on the substrate table and supported by burls, the burls forming a burl area across the measurement substrate, wherein the marks may be located within the burl area and the separation of the marks may be less than a pitch of the burls.

Locating the marks within the burl area and having a separation that is less than a pitch of the burls advantageously allows thermal expansion of the measurement substrate to be measured between the burls rather than across the burls, thus reducing the consideration of potentially complicating restoring forces provided by the burls when determining a power of the radiation.

The patterning device may comprise the target.

Having the target as part of the patterning device advantageously allows radiation to be analyzed in a portion of a lithographic apparatus that is between an illumination system and a projection system of the lithographic apparatus. In the case of dual stage lithographic apparatus, having a patterning device that comprises the target avoids having to move the target between a time at which the target is illuminated with radiation and the time at which the target is measured by the position measurement system, thus reducing heat transfer from the target to its surroundings before the measurement of the marks may take place.

The target may be a measurement plate mounted on the support structure via flexures.

The target may be a measurement plate mounted on the substrate table via flexures.

Mounting the measurement plate on the support structure and/or the substrate table via flexures advantageously provides thermal isolation of the target whilst allowing unrestricted thermal expansion of the measurement plate.

The flexures may comprise leaf springs.

According to a second aspect of the invention, there is provided a method of analysing radiation, the method comprising providing a target, the target comprising two marks separated from each other, illuminating the target with radiation thereby inducing thermal expansion of the target, measuring a change in the separation of the marks and determining a power of the radiation using the measured change in separation of the marks.

The target may be thermally isolated from its surroundings.

Multiple targets may be provided, and different targets may have different radiation absorption properties.

The target may be illuminated with radiation until a temperature of the target has increased by a value within the inclusive range of 1K to 10K.

The temperature increase caused when the target is illuminated by the radiation beam may be selected to provide a balance between achieving a desired measurement uncertainty and avoiding strong cooling effects acting on the wafer. A temperature increase of between 1K and 10K has been found to be a preferable range to achieve this balance.

Heating and/or cooling effects acting on the target that are not due to the radiation may be modelled and accounted for when determining the power of the radiation.

Modelling and accounting for such heating and/or cooling effects advantageously increases the accuracy of the method of analyzing radiation.

A coefficient of thermal expansion of the target may be within the inclusive range of 2 ppm $K^{-1}$ to 30 ppm $K^{-1}$.

The target may advantageously have a coefficient of thermal expansion that provides significant thermal expansion of the target when illuminated with radiation. This range has been found to be well suited to the present method.

A specific heat capacity of the target may be within the inclusive range of 1 $J\ cm^{-3}K^{-1}$ to 3 $J\ cm^{-3}K^{-1}$.

The target may advantageously have a specific heat capacity that provides a significant increase in temperature of the target when the target is illuminated with radiation. This range has been found to be well suited to the present method.

A thickness of the target may be in the inclusive range of 0.1 mm to 1.0 mm.

A delay between a time at which the target is no longer illuminated with radiation and a time at which the change in separation of the marks is measured may be within the inclusive range of 0.5 seconds to 5.0 seconds.

Keeping the delay within this range may advantageously reduce negative effects on the accuracy of the radiation analysis system caused by cooling of the target.

A cooling of the target may be interrupted when the radiation analysis system is in use.

Interrupting a cooling of the target may advantageously reduce heat transfer between the target and its surroundings, thus increasing the accuracy of the radiation analysis system.

According to a third aspect of the invention, there is provided a computer readable medium for storing computer readable code wherein the code causes a lithographic apparatus to perform the method of the second aspect of the invention or any of its associated options.

BRIEF DESCRIPTION OF THE DRAWINGS

Embodiments of the invention will now be described, by way of example only, with reference to the accompanying schematic drawings, in which:

FIG. 3 schematically depicts a radiation analysis system according to an embodiment of the invention;

FIG. 7, consisting of FIG. 7A and FIG. 7B, schematically depicts a support structure comprising first, second and third measurement plates which form part of the radiation analysis system according to an embodiment of the invention;

DETAILED DESCRIPTION

Figure 1:
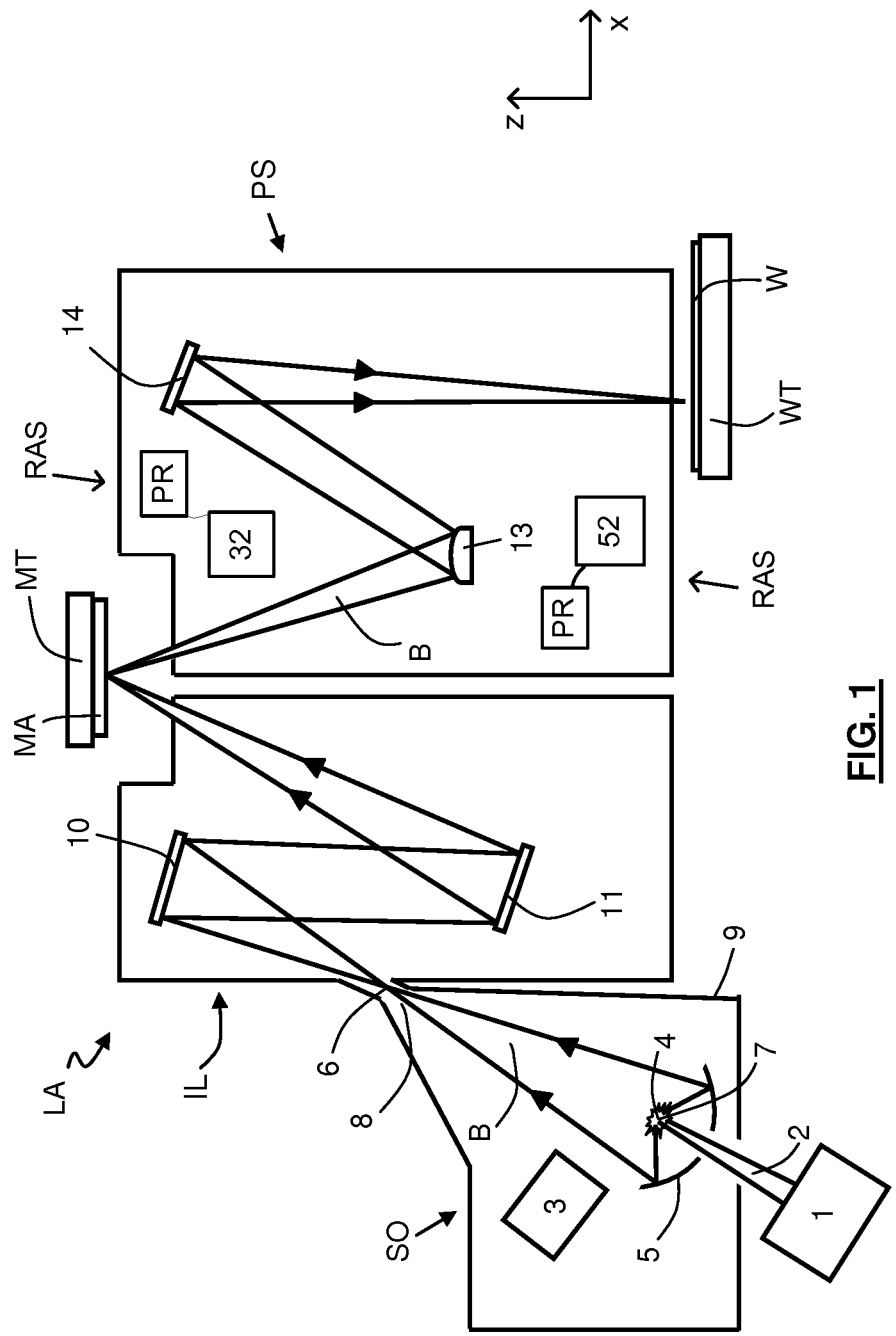
FIG. 1 depicts a lithographic system comprising a lithographic apparatus with a radiation analysis system according to an embodiment of the invention.

FIG. 1 schematically depicts a lithographic system including a lithographic apparatus and two radiation analysis systems RAS according to an embodiment of the invention. One of the radiation analysis systems RAS, comprising a target 32 and a processor PR, is located at a patterning device (i.e. mask) region of the lithographic apparatus LA. The other radiation analysis system RAS, comprising a target 52 and a processor PR, is located at a substrate W region of the lithographic apparatus LA. The lithographic apparatus LS may comprise a single radiation analysis system RAS.

The lithographic system comprises a radiation source SO and the lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared (IR) radiation.

The lithographic apparatus may be of a type having two (dual stage) or more substrate tables. In a dual stage lithographic apparatus two substrate tables are provided in order to allow properties of one substrate to be measured whilst exposure of another substrate is taking place ("exposure of a substrate" means projection of patterned radiation onto the substrate as described above).

Figure 2:
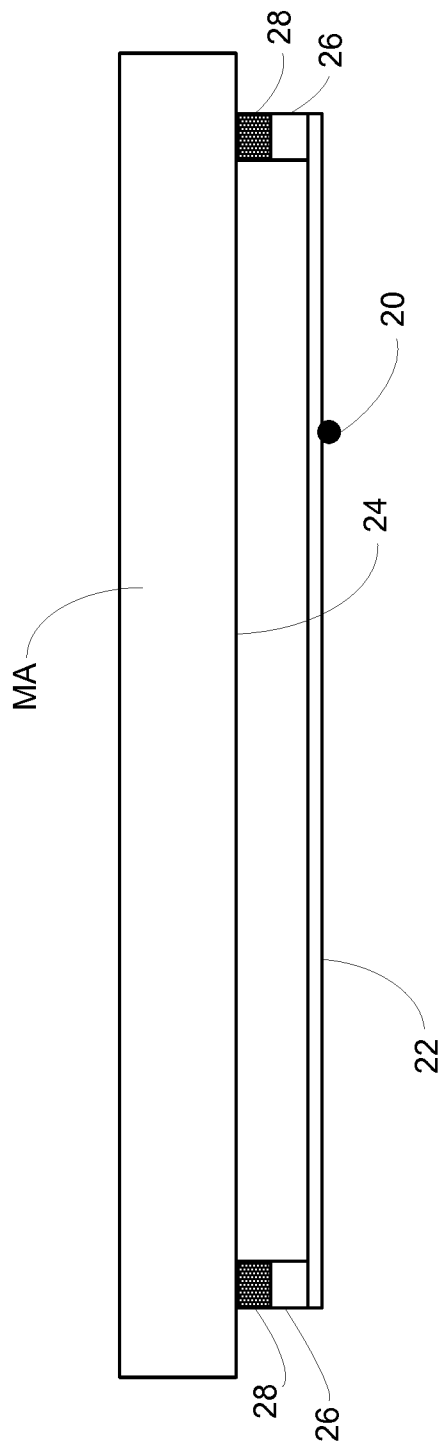
FIG. 2 schematically depicts a pellicle fitted to a patterning device.

The wavelength and/or power of the radiation beam B is selected in light of a number of factors. For example, the lithographic apparatus may comprise a pellicle configured to protect the mask MA from contaminant particles. FIG. 2 is a schematic diagram of a pellicle 22 fitted to a patterning device MA. The patterning device MA has a patterned surface 24. A pellicle frame 26 which supports the pellicle 22 is provided with an attachment mechanism 28. The attachment mechanism 28 may be configured to allow the pellicle frame 26 to be removably attachable to the mask MA (i.e. to allow the pellicle frame 26 to be attachable to and detachable from the mask MA). The attachment mechanism 28 is configured to engage with an attachment feature (not shown) provided on the mask MA. The attachment feature may, for example, be a protrusion which extends from the mask MA. The attachment mechanism 28 may, for example, comprise a locking member which engages with the protrusion and secures the pellicle frame 26 to the mask MA. A contamination particle 20 was incident upon the pellicle 22 and is held by the pellicle 22. The pellicle 22 holds the contamination particle 20 sufficiently far from the patterned surface 24 of the mask MA that it is not imaged onto substrates by the lithographic apparatus. The pellicle 22 may, for example, be formed from a material such as polysilicon (pSi) film, graphene or silicene.

The pellicle 22 may be able to withstand a threshold amount of power incident upon it without becoming damaged and/or becoming inoperative. The pellicle 22 may degrade and/or become damaged such that the pellicle 22 is inoperative when a radiation beam having more power than the threshold power is incident upon the pellicle 22. The pellicle 22 may have suitable transmission properties for radiation within a pre-determined wavelength range. The pellicle 22 may absorb too high a proportion of the radiation beam if the radiation beam comprises one or more wavelengths of radiation outside of the pre-determined wavelength range. As a further example, the power of the radiation beam may be selected to achieve a desired throughput of patterned substrates. The wavelength of the radiation beam may be selected to achieve a desired feature size on the substrate W. Other factors may also affect the power and/or the wavelength selected for the radiation beam.

Referring again to FIG. 1, the power carried by the radiation beam B may be measured at different regions of the lithographic apparatus LA. The power of the radiation beam B may, for example, be measured in the region of the substrate W and substrate table WT to determine, for example, whether or not the amount of power reaching the substrate W is sufficient to achieve a desired throughput of patterned substrates. As another example, the power of the radiation beam B may be measured in the region of the patterning device (e.g. mask MA) and the support structure MT to determine, for example, whether or not the power incident on the pellicle is below the threshold power of the pellicle (i.e. the power is below a level which will damage the pellicle). The power of the radiation beam B may be measured at any desired region of the lithographic apparatus LA.

A known method of measuring the power of the radiation beam B at a region of the lithographic apparatus LA includes providing one or more photodetectors at that region of the lithographic apparatus LA. For example, in the case of measuring the power of the radiation beam B in the region of the substrate W, a photodetector may be provided on the substrate table WT. The photodetector may, for example, be a pinhole sensor comprising a photodiode located underneath a small aperture. The radiation beam B may be directed towards the aperture such that all or part of the radiation beam B passes through the aperture and is incident on the photodiode. The photodiode detects the incident radiation by converting incident photons into charge carriers which then contribute to an electrical read-out signal that may be used to determine the power of the radiation beam B.

As another example of a known system, in the case of measuring the power of the radiation beam B in the region of the mask MA, one or more photodetectors may be provided between the illumination system IL and the mask MA, e.g. adjacent an exposure slit of the illumination system IL.

The photodetector may have a relatively high degree of uncertainty when used to detect certain forms of radiation. For example, EUV radiation may produce a plurality of charge carriers in the photodetector for every photon of EUV radiation absorbed by the photodetector. The relationship between the number of charge carriers generated per photon of EUV radiation absorbed by the photodetector may have an inherent degree of uncertainty associated with it. This inherent uncertainty may contribute to the relative high degree of uncertainty associated with EUV power measurements made using the photodetector.

The photodetector may be calibrated by comparing measurements made using the photodetector to the results of an exposure of a resist provided on a substrate. The resist may be exposed to a radiation beam with different doses in different areas of the resist. The resist may be used to determine the dose of radiation incident on the resist and the power of the radiation beam may be determined therefrom. Variations in the resist may negatively affect the accuracy of the calibration. For example, variations in the temperature of the resist, the concentration of different chemicals in the resist, the distribution of the resist across the substrate after spin coating the substrate with the resist, and any batch-to-batch variations of the resist may negatively affect the accuracy of the calibration. The calibration may, for example, have an uncertainty of between approximately 10% and 20%. The photodetector may, for example, have a measurement uncertainty of approximately 10% to 20% due to the uncertainty associated with the calibration.

The photodetector may not be accurately calibrated between different lithographic apparatus LA. That is, the uncertainty of measurements performed by photodetectors in different lithographic apparatus LA may vary between, for example, approximately 10% and 20% in their measurements of radiation beam B power.

The photodetector may not be stable over time. The measurement sensitivity of the photodetector may degrade over time due to radiation damage. The photodetector may become contaminated. For example, EUV radiation present in the radiation beam B may react with constituent parts of a resist and generate contaminants such as oxides, silicates and/or carbon. The contaminants may be incident on the photodetector and negatively affect the accuracy of the photodetector. Contamination of the photodetector may grow over time such that the uncertainty of measurements made using the photodetector increases over time.

In the case of an LPP source, radiation produced by the $CO_2$ laser may be present in the radiation beam B in the lithographic apparatus LA. For example, IR radiation from the LPP source may undergo unwanted reflections and be present in the lithographic apparatus LA. IR radiation generated by the LPP source may, for example, comprise radiation having a wavelength of approximately 10.5 µm. The presence of IR radiation in the lithographic apparatus may negatively affect the accuracy with which lithographic exposures are performed. The photodetector may only be able to detect a limited range of wavelengths of radiation. For example, the photodetector may be capable of detecting DUV, EUV and/or visible radiation, but the photodetector may not be capable of detecting IR radiation. A separate photodetector may be required to measure the power of certain wavelengths such as, for example, IR radiation present in the radiation beam B.

The problems mentioned above in relation to the contemporary use of a photodetector in a lithographic apparatus LA may result in power measurements having large uncertainties. For example, the uncertainty with which the power of the radiation beam B is measured may be approximately 20%. Having such uncertain power measurements leads to difficulties when comparing different lithographic apparatus LA. Power measurements having high uncertainties may also lead to preventative restrictions being applied to the lithographic system to account for the uncertainties. For example, a power measurement having an uncertainty of approximately 20% may result in the power of the radiation beam being reduced by 20% or more to ensure that the pellicle 22 does not degrade and/or is not damaged during a lithographic exposure. Reducing the power of the radiation beam negatively affects the throughput of the lithographic apparatus LA. Alternatively, if the power of the radiation beam has an uncertainty of, for example, 20% then failing to reduce the power of the radiation beam by 20% may result in a damaged pellicle 22. A damaged pellicle 22 would require replacing and the lithographic apparatus and/or the reticle may require repair, resulting in a significant loss of availability of the lithographic apparatus LA when the pellicle 22 is damaged.

FIG. 3 schematically depicts a radiation analysis system RAS according to an embodiment of the invention. The radiation analysis system RAS comprises a radiation source 30, a target 31 and a position measurement system 32. The radiation source 30 depicted in FIG. 3 may correspond with the radiation source SO and the illumination system IL depicted in FIG. 1. The radiation source 30 is configured to generate a radiation beam 33. The radiation beam 33 may, for example, comprise EUV radiation, DUV radiation, and/or IR radiation. The radiation beam 33 may comprise other wavelengths of radiation, e.g. visible radiation. The radiation beam 33 is directed towards the target 31. In the example of FIG. 3, the target 31 is configured for use at a mask region of a lithographic apparatus LA such as the lithographic apparatus depicted in FIG. 1.

The target comprises two marks (not shown) separated from each other. The target may comprise more than two marks. The separation between the marks is known at a known temperature. The target 31 may comprise a measurement plate. The measurement plate 31 may comprise a metal, e.g. aluminium. The measurement plate 31 may comprise another suitable material such as a semiconductor, e.g. silicon. The measurement plate 31 may, for example, be provided on the mask MA. For example, the measurement plate 31 may be provided on a surface of the mask MA. Alternatively, the measurement plate 31 may be provided on the mask table MT. The measurement plate 31 may be mounted on the mask MA via flexures 35. The flexures 35 may be configured to thermally isolate the measurement plate 31 from the mask MA such that the majority of energy absorbed by the measurement plate 31 from the radiation beam 33 induces thermal expansion of the measurement plate 31 rather than being lost to its surroundings. The flexures 25 may be configured to permit thermal expansion and subsequent contraction of the measurement plate 31. For example, the flexures 25 may be configured to permit substantially unimpeded thermal expansion and subsequent contraction of the measurement plate 31. The flexures 35 may, for example, comprise leaf springs.

The measurement plate 31 may, for example, be comprised of a sheet of aluminium (which may be referred to as an aluminium foil). The measurement plate 31 may comprise other materials such as, for example silicon and/or steel. The measurement plate may have a thickness in the range of approximately 0.1 mm to approximately 1.0 mm. The measurement plate 31 may, for example, have a thickness of approximately 0.5 mm. Depending in part upon the material used to form the measurement plate, a thin measurement plate may result in unwanted thermal deformation rather than thermal expansion, whereas a thick measurement plate may require a large amount of energy to exhibit a measurable thermal expansion, therefore the thickness of the measurement plate may be selected with these considerations in mind. Examples of marks are schematically depicted in FIG. 4.

The radiation beam 33 is incident upon the measurement plate 31. Preferably the entire radiation beam 33 is incident on the measurement plate 31. Having the entire radiation beam 33 incident on the measurement plate 31 is beneficial because this maximizes the signal to noise ratio of the radiation analysis system RAS. The measurement plate 31 is configured to absorb energy from the radiation beam 33 and undergo thermal expansion.

The marks on the measurement plate 31 are configured to reflect and/or diffract incident radiation 33. After the target 31 has been illuminated by the radiation beam 33, the position measurement system 32 may illuminate the marks with a measurement radiation beam. Alternatively, a separate radiation source may illuminate the marks with a measurement radiation beam. At least some of the measurement radiation beam reflects and/or diffracts from the marks. Radiation reflected and/or diffracted from the marks is incident upon the position measurement system 32. The position measurement system 32 is configured to detect the radiation reflected and/or diffracted from the marks on the measurement plate 31 and determine a change in separation of the marks. The position measurement system 32 may provide one or more signals indicative of the change in separation of the marks to a processor PR. The processor PR may be configured to receive the one or more signals from the position measurement system 32 and determine a power of the radiation beam 33.

Thermal expansion of the measurement plate 31 causes the separation between the marks to increase. Once the radiation beam 33 has been incident on the measurement plate 31 for a desired amount of time or until the temperature of the target 31 has increased by a desired amount, the radiation beam 33 may be stopped or redirected such that the radiation beam 33 is no longer incident on the measurement plate 31. The position measurement system 32 may be used to determine the change in separation of the marks after the measurement plate 31 has undergone thermal expansion induced by absorption of power from the radiation beam 33.

The target 31 may be thermally isolated such that heat transfer between the target 31 and its surroundings is limited. For example, the target 31 may be thermally isolated such that the majority of power absorbed from the radiation beam 33 induces thermal expansion of the target 31 rather than being lost to the target's surroundings. The target 31 may be kept under vacuum conditions.

Figure 4B:
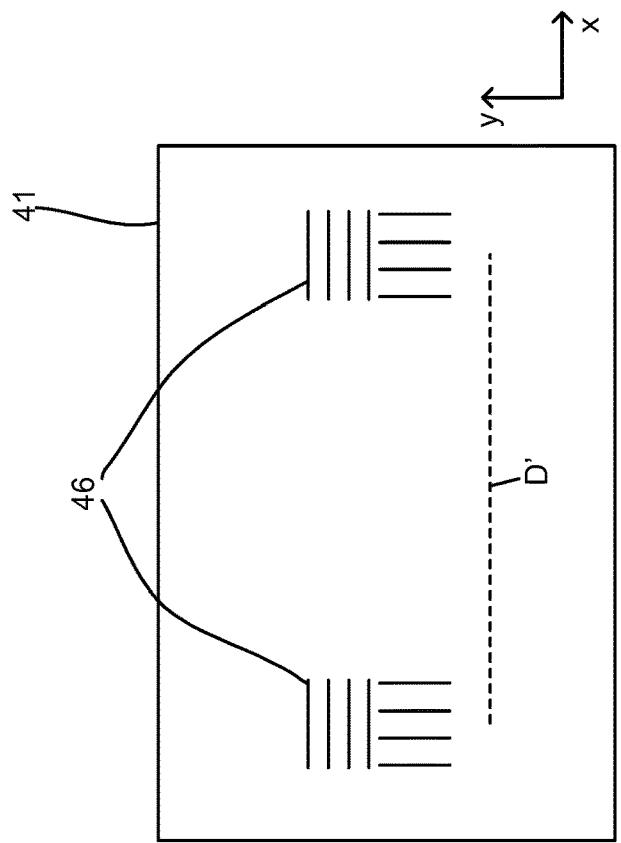
FIG. 4, consisting of FIG. 4A and FIG. 4B, schematically depicts a target which forms part of the radiation analysis system according to an embodiment of the invention.
Figure 4A:
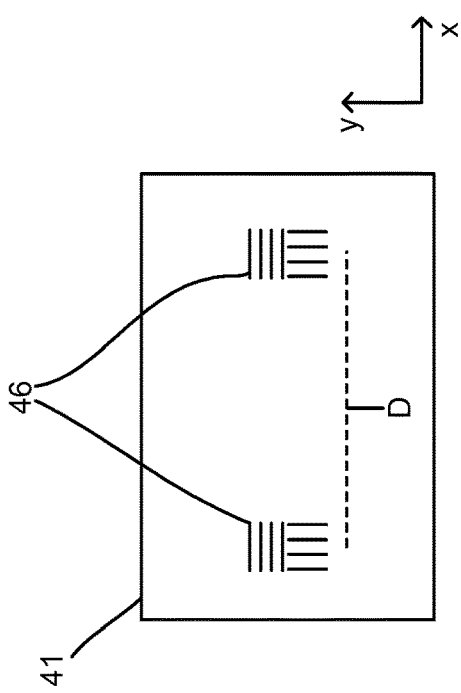

FIG. 4, consisting of FIG. 4A and FIG. 4B, schematically depicts a target according to an embodiment of the invention. In the example of FIG. 4, the target 41 is a measurement plate. The measurement plate 41 shown in FIG. 4 may correspond with the measurement plate 31 shown in FIG. 3. Other examples of targets are discussed below. FIG. 4A shows the measurement plate 41 before the measurement plate 41 has absorbed power from the radiation beam. FIG. 4B shows the measurement plate 41 after the measurement plate 41 has undergone thermal expansion induced by absorbed power from the radiation beam. The measurement plate 41 comprises two marks 46 having separated from each other by a distance D. The separation D may be large enough such that the entire radiation beam fits within the separation. The size of the radiation beam may be determined by an exposure slit size of the lithographic apparatus. The separation D may, for example, be greater than or equal to approximately 20 mm. The separation D may, for example, be less than or equal to approximately 110 mm.

The separation D may, for example, be 104 mm. The separation D may be larger than the size of the exposure slit. However, having a separation D that is greater than an exposure slit size may not be preferred because that configuration may introduce complicated temperature gradients on the measurement plate that increase the difficulty with which a thermal expansion of the target may be determined, thereby decreasing the accuracy of the radiation analysis system. As may be seen on comparison between FIG. 4A and FIG. 4B, the separation D between the marks 46 increases to a larger separation D' due to thermal expansion of the measurement plate 41 induced by the radiation beam 33. The marks 46 and the separation D between the marks has been exaggerated in FIG. 4 for visibility. The change in separation D between the two marks 46 may be represented by the following equation:

$$dx = f(dT) = f(Q_{in})$$

wherein dx is the change in separation D of the two marks 46, f(dT) is a known function of the change in temperature of the target 41 and $f(Q_{in})$ is a known function of the material properties of the target and the amount of radiative energy absorbed by the target 41. The functions may be determined by performing calibration measurements. That is, the target 41 may be illuminated with a known amount of radiative power and a change in temperature of the target and/or a change in separation of the marks of the target may be measured. Alternatively, the functions may be determined by modelling. For example, information relating to material properties of the target 41 may be input into a computer simulation and the computer simulation may be executed to determine the functions. Information relating to material properties of the target 41 may, for example, include tabulated values of thermal expansion coefficient, specific heat capacity, etc.

In the example of FIG. 4, each mark 46 comprises two orthogonal gratings. The marks 46 may comprise other types of gratings such as, for example, checkerboard gratings. The marks 46 may have any desired shape and/or size that is suitable for use with the position measurement system 32. It is to be understood that the term marks as used herein is intended to encompass two distinguishable features separated by a distance. There could be other features between the marks. For example, the features may be joined together by some other feature.

A detailed example of the radiation analysis system RAS is now discussed. The target 41 may comprise an aluminium plate provided on the mask (not shown) via flexures as described above. The aluminium plate 41 may, for example, have a length of 110 mm, a width of 20 mm and a thickness of 0.5 mm. In this example, the aluminium plate 41 would have a weight of approximately 3 g. Given the above characteristics of the aluminium plate 41, the temperature of the aluminium plate may increase by approximately 0.4 Kelvin per Joule of energy that the aluminium plate absorbs from the radiation beam 33. The separation D between the two marks 46 may increase by approximately 1 nm per mJ of energy absorbed by the aluminium plate 41.

Known position measurement systems are capable of measuring the positions of the marks to a high degree of accuracy, therefore the position measurement system is not a significant source of measurement uncertainty for the radiation analysis system RAS. It may be assumed that there is a measurement uncertainty associated with the position measurement system of approximately 0.5 nm per mark (i.e. a 1 nm measurement uncertainty for the relative change in separation D for both marks 46). It may also be assumed that there is negligible cooling of the measurement plate 41 between a time at which the radiation beam 33 is no longer incident on the measurement plate 41 and a time at which a measurement of the change in separation of the marks 46 takes place. For example, a delay between a time at which the target is no longer illuminated with radiation and a time at which the change in separation of the marks is measured may be within the inclusive range of 0.5 seconds to 5.0 seconds. Given the above assumptions, the measurement uncertainty associated with the position measurement system 32 may be approximately 0.1% per Joule of absorbed energy (i.e. 0.1% per Watt of absorbed power). For example, if the power of EUV radiation incident on the aluminium plate 41 is approximately 35 W, then a measurement uncertainty of less than 1% may be obtained in approximately 5 ms of exposure to the EUV radiation, which would result in a temperature increase of the aluminium plate 41 of approximately 1 K.

The uncertainty associated with measurements made using the radiation analysis system RAS may partially depend upon the amount of radiative power that is incident on the target 41. Increasing the amount of power incident on the target 41 may result in the radiation analysis system RAS having an increased signal-to-noise ratio. The amount of power incident on the target 41 may be increased by increasing the amount of time for which the radiation beam is incident on the target 41. The amount of time that the radiation beam is incident on the target 41 may therefore be selected to achieve a desired measurement uncertainty for the radiation analysis system RAS. On the other hand, illuminating the target 41 with the radiation beam for a long time may heat the target 41 such that the target 41 is at a significantly higher temperature than its surroundings. Cooling effects acting on the target 41 become more significant when there a greater temperature difference exists between the target 41 and its surroundings. Significant cooling effects may negatively affect the accuracy of the radiation analysis system RAS. Significant cooling effects may be difficult to account for when determining the power of the radiation beam. The amount of time for which the target 41 is illuminated by the radiation beam may therefore be selected to provide a balance between achieving a desired measurement uncertainty and avoiding strong cooling effects acting on the wafer. It may be preferable to use the radiation beam to increase the temperature of the target 41 by, for example, approximately 1 K to 10 K.

The measurement uncertainty associated with the calculated power of the radiation beam may, for example, be approximately 0.5%. The conversion from the change in separation of the marks 46 to the power of the radiation beam 33 may involve a number of calculations and assumptions that have corresponding uncertainties relating to, for example, the material properties of the target 41 (e.g. thermal expansion coefficient, specific heat capacity, etc.), the radiation absorption properties of the target 41 (e.g. the reflection, transmission and absorption properties of the target 41 for different wavelengths of radiation), cooling and/or heating effects acting on the target 41, etc. For example, a small amount of gas (e.g. hydrogen) at a pressure well below atmospheric pressure may be provided in the illumination system IL and/or the projection system PS. The gas may conduct heat to and/or from the target 41 between a time at which the radiation beam 33 is no longer incident on the target 41 and a time at which a change in separation of the marks 46 is measured by the position measurement system 32.

The largest contributor of uncertainty to measurements made using the radiation analysis system RAS is expected to arise from assumptions made in relation to the material properties and/or the radiation absorption properties of the target 41. For example, the target 41 may be configured to absorb EUV radiation and reflect IR radiation. However, some IR radiation may be absorbed by the target 41 and the associated power may subsequently be erroneously attributed to power originating from EUV radiation. It may therefore be desirable to make accurate assumptions relating to the material properties and/or the spectral absorption properties of the target 41. This may include performing measurements of the target 41 before using it in the radiation analysis system RAS in order to better understand the target's material properties and/or spectral absorption properties.

In another embodiment of the invention, the mask MA may be configured to be the target 31 of the radiation analysis system RAS. That is, a conventional mask MA may be modified such that it comprises two marks separated from each other. Conventional masks are configured to resist thermal expansion when illuminated with radiation in order to avoid changes in the size of the pattern on the mask throughout a lithographic exposure. A modified mask for use with the radiation analysis system RAS may be configured to undergo thermal expansion when illuminated with radiation such that a separation between the marks on the modified mask increases. The modified mask may be designed such that it has a specific heat capacity that allows sufficient thermal expansion when illuminated with radiation.

In an embodiment, the radiation analysis system RAS may be configured to analyse characteristics of radiation at the substrate region of a lithographic apparatus LA. For example, as shown in FIG. 1, the target may be located at the substrate region of a lithographic apparatus LA. For example, in a similar configuration to the target depicted in FIG. 3, a measurement plate comprising two marks having separated from each other may be provided on a substrate table WT of a lithographic apparatus LA.

Figure 5:
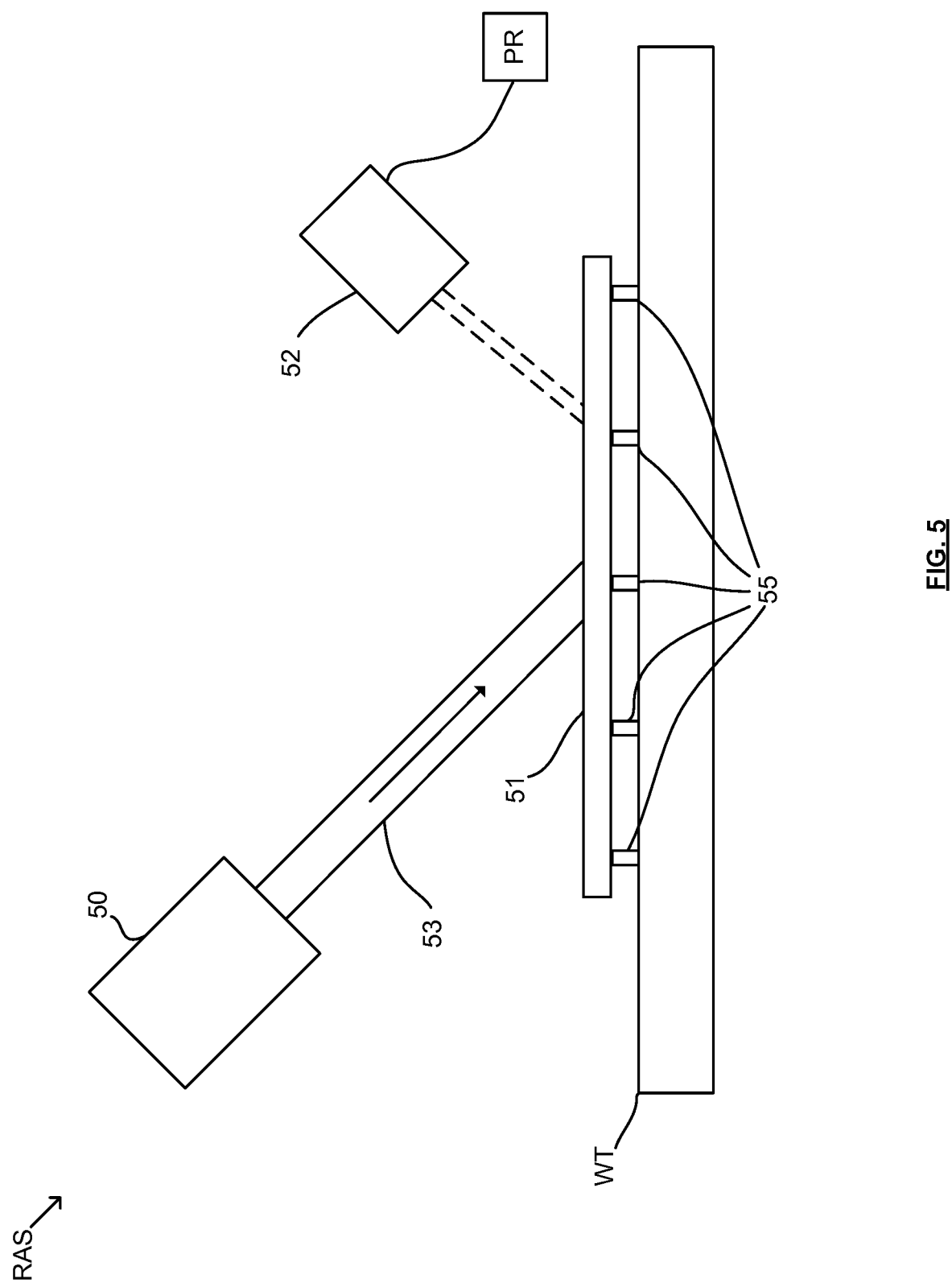
FIG. 5 schematically depicts a radiation analysis system according to an embodiment of the invention.

In an embodiment the target may comprise a substrate. FIG. 5 schematically depicts a radiation analysis system RAS according to an embodiment of the invention. The radiation analysis system RAS comprises a radiation source 50, a target 51 and a position measurement system 52. A radiation beam 53 generated by the radiation source 50 depicted in FIG. 5 may correspond with the radiation beam B exiting the projection system PS depicted in FIG. 1. The radiation beam 53 may comprise EUV radiation, DUV radiation, and/or infrared (IR) radiation. The radiation beam 53 may comprise other wavelengths of radiation such as, for example, visible radiation. The radiation beam 53 is directed towards the target 51. In the example of FIG. 5, the target 51 is a measurement substrate mounted on a substrate table WT. The measurement substrate 51 is supported on the substrate table WT by burls 55. The measurement substrate 51 may be configured for use at a substrate region of a lithographic apparatus LA.

The radiation beam 53 is incident upon the measurement substrate 51. Preferably the entire radiation beam 53 is incident on the measurement substrate 51 to increase a signal-to-noise ratio of the radiation analysis system RAS. The measurement substrate 51 may, for example, have a diameter of approximately 300 mm and a thickness of approximately 0.7 mm. The measurement substrate 51 is configured to absorb energy from the radiation beam 53 and undergo thermal expansion.

The measurement substrate 51 comprises two marks (not shown in FIG. 5) separated from each other by a known distance at a known temperature. The measurement substrate 51 may comprise more than two marks. The marks on the measurement substrate 51 are configured to reflect and/or diffract incident radiation 53. After the target 51 has been illuminated by the radiation beam 53, the position measurement system 52 may illuminate the marks with a measurement radiation beam. Alternatively, a separate radiation source may illuminate the marks with a measurement radiation beam. At least some of the measurement radiation beam reflects and/or diffracts from the marks. Radiation reflected and/or diffracted from the marks is incident upon the position measurement system 52. The position measurement system 52 is configured to detect the radiation reflected and/or diffracted from the marks on the measurement substrate 51 and determine a change in separation of the marks. The position measurement system 52 may provide a signal indicative of the change in separation of the marks to a processor PR. The processor PR may be configured to receive the signal from the position measurement system 52 and determine a power of the radiation beam 53.

Contemporary substrates are configured to resist thermal expansion when illuminated with radiation in order to, for example, maintain the size of target portions on the substrate throughout a lithographic exposure. A measurement substrate 51 suitable for use with the radiation analysis system RAS is configured to undergo thermal expansion when illuminated with radiation 53 such that the separation between the marks increases. The burls 55 may limit a thermal expansion of the measurement substrate 51. The marks may, for example, be positioned between the burls 55.

Material properties of the measurement substrate 51 may be selected to provide significant thermal expansion of the measurement substrate 51 when illuminated with the radiation beam 53. For example, the measurement substrate 51 may comprise a material that has a coefficient of thermal expansion that provides significant thermal expansion of the measurement substrate 51 when illuminated with radiation. The measurement substrate 51 may, for example, have a thermal expansion coefficient in the range of approximately 2 ppm $K^{-1}$ to approximately 30 ppm $K^{-1}$. As a further example, the measurement substrate 51 may comprise a material that has a specific heat capacity that provides a significant increase in temperature of the measurement substrate 51 when the measurement substrate 51 is illuminated with radiation. For example, the measurement substrate 52 may have a specific heat capacity in the range of approximately 1 J $cm^{-3}K^{-1}$ to approximately 3 J $cm^{-3}$ $K^{-1}$. Increasing the specific heat capacity may decrease a thermal response time of the radiation analysis system and, on the other hand, make the radiation analysis system less susceptible to spurious heating and/or cooling effects that may not be accounted for when determining a change in separation of the marks. The measurement substrate 51 may, for example, comprise aluminium, steel, and/or silicon.

Figure 6:
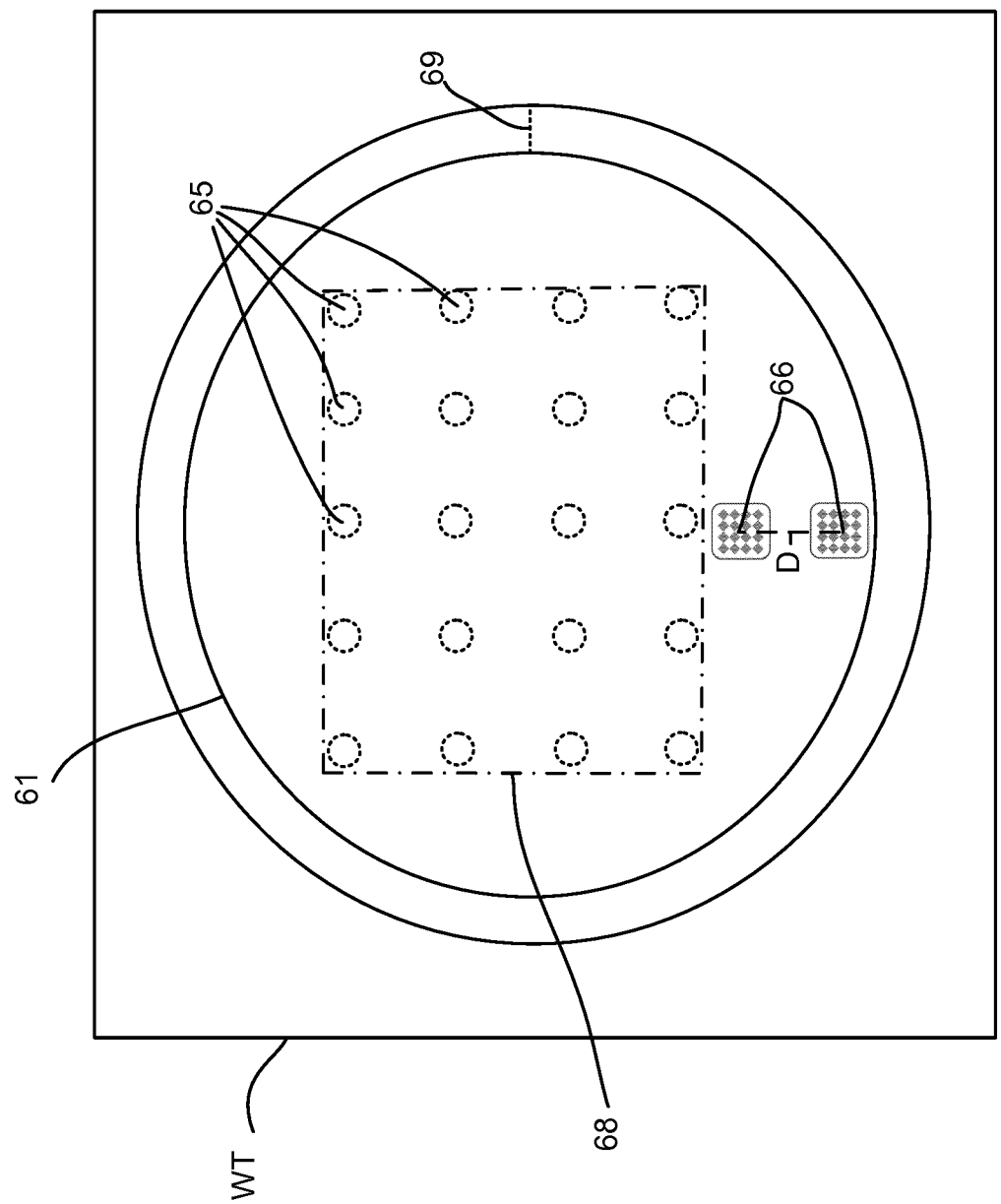
FIG. 6 schematically depicts a measurement substrate which forms part of the radiation analysis system according to an embodiment of the invention.

FIG. 6 schematically depicts a measurement substrate 61 according to an embodiment of the invention. The measurement substrate 61 is mounted on a substrate table WT and is supported by burls 65. When the measurement substrate 61 has been heated by the radiation beam 53, heat energy may transfer from the measurement substrate 61 to the substrate table WT through the burls 65. Heat transfer from the measurement substrate 61 to the substrate table WT may be accounted for by, for example, computer modelling when converting the measured mark positions to a power of the radiation beam 53. However, given the small contact area between the burls 65 and the measurement substrate 61, the heat transfer through the burls 65 does not significantly affect the measurement uncertainty associated with the radiation analysis system RAS.

The burls 65 define a burl area 68 across the measurement substrate 61. The burl area 68 depicted in FIG. 6 is an example of a burl area. The burl area 68 may take other forms. When the measurement substrate 61 absorbs power from the radiation beam 53, the resulting thermal expansion of the measurement substrate 61 is limited by the burls 65 within the burl area 68. That is, the burls 65 provide a restoring force that restricts the thermal expansion of the measurement substrate 61. An area of the measurement substrate 61 that is outside of the burl area 68 may expand more freely (e.g. uniformly). The measurement substrate 61 is provided in a recess of the substrate table WT. A gap 69 exists between the measurement substrate 61 and the edge of the recess of the substrate table WT to allow thermal expansion of the measurement substrate 61.

The measurement substrate 61 comprises two marks 66 provided on the measurement substrate 61 that are separated from each other by a distance D. In the example of FIG. 6 the marks 66 comprise a checkerboard grating. The marks 66 may take other forms. The marks 66 may preferably be placed outside of the burl area 68 such that the separation D between the marks 66 increases more freely when the measurement substrate 61 undergoes thermal expansion. Alternatively, the marks 66 may be located within the burl area 68. When the marks 66 are located within the burl area 68, the separation of the marks 66 may be smaller than a pitch of the burls 65 so that thermal expansion of the measurement substrate 61 can be measured between the burls 65 rather than across the burls 65. The positions of the marks 66 may be measured by the position measurement system 52. The processor PR may receive a signal from the position measurement system 52 that is indicative of the change in separation of the marks 66 and determine a power of the radiation beam 53.

The measurement substrate 61 may comprise a recess configured to accommodate a measurement plate that may act as a target for the radiation analysis system RAS. The recess may be formed by, for example, thinning the substrate 61 across a desired area. The measurement plate may be mounted in the recess via flexures such as, for example, leaf springs. The measurement plate may, for example, comprise aluminium. The measurement plate may project above the measurement substrate 61.

The mask table MT and/or the support structure WT may comprise a cooling system configured to cool the mask MA or the substrate W respectively. Cooling of the target between a time at which the radiation beam is no longer incident on the target and a time at which the positions of the marks on the target are measured may negatively affect the accuracy of the radiation analysis system RAS. A delay between a time at which the target is no longer illuminated with radiation and a time at which the change in separation of the marks is measured may be within the inclusive range of 0.5 seconds to 5.0 seconds to reduce negative effects on the accuracy of the radiation analysis system RAS caused by cooling of the target. The amount of cooling provided by the cooling system may be reduced during use of the radiation analysis system RAS such that a transfer of power absorbed by the target to the cooling system is limited.

The power associated with different wavelengths of radiation present in the radiation beam may be analysed by the radiation analysis system RAS by providing the target with spectral filters and/or wavelength-dependent reflectivity and/or absorption properties. FIG. 7, consisting of FIG. 7A and FIG. 7B, schematically depicts a support structure MT comprising first, second and third targets 71, 72, 73 according to an embodiment of the invention. FIG. 7A depicts the targets 71, 72, 73 before they are exposed to the radiation beam. FIG. 7B depicts the targets 71, 72, 73 after they have undergone thermal expansion due to power absorbed from the radiation beam. The extent of thermal expansion of the targets 71, 72, 73 has been exaggerated in FIG. 7 for visibility.

In the example of FIG. 7 the targets 71, 72, 73 are measurement plates. Each measurement plate 71, 72, 73 comprises two marks 76 that are separated from each other by a distance D. The measurement plates 71, 72, 73 may comprise different materials having different material properties (i.e. thermal expansion coefficients, specific heat capacities, etc.) and/or different radiation absorption properties (i.e. absorption, reflection and/or transmission coefficients for different wavelengths of radiation). For example, the first measurement plate 71 may comprise a material that absorbs EUV radiation, visible radiation and IR radiation. The first measurement plate 71 may comprise a doped semiconductor material such as, for example doped silicon or silicon nitride. The second measurement plate 72 may comprise a material or coating that absorbs EUV radiation and visible radiation and reflects IR radiation. The second measurement plate 72 may comprise a metal silicide such as, for example, RuSi. Alternatively, the second measurement plate 72 may comprise a highly doped semiconductor such as, for example, phosphor-doped silicon having a P-doping concentration of at least about $10^{20}$ atoms per cubic centimeter. As a further alternative, the second measurement plate 72 may comprise a doped semiconductor having an infrared emissivity greater than about 0.2. The third measurement plate 73 may comprise a material that absorbs EUV radiation and reflects visible radiation and IR radiation. The third measurement plate 73 may comprise a metal, such as aluminium. As can be seen on comparison between FIG. 7A and FIG. 7B, the first measurement plate 71 has undergone the largest thermal expansion, the second measurement plate 72 has undergone a smaller thermal expansion than the first measurement plate 71, and the third measurement plate 73 has undergone the smallest thermal expansion.

The power of EUV radiation, visible radiation and IR radiation present in the radiation beam may be determined using the radiation analysis system RAS for each set of marks 76 on each measurement plate 71, 72, 73. For example, the power of EUV radiation in the radiation beam may be determined by measuring the change in separation (D3−D) of the third measurement plate 73 and using knowledge of the material properties of the third measurement plate 73 to calculate the power absorbed by the third measurement plate 73. The power of visible radiation present in the radiation beam may be determined in a two-step process. The first step includes measuring the change in separation (D2−D) of the second measurement plate 72 and using knowledge of the material properties of the second measurement plate 72 to calculate the power absorbed by the second measurement plate 72. The second step includes calculating the difference between the amount of power absorbed by the second measurement plate 72 and the amount of power absorbed by the third measurement plate 73 (i.e. the calculated amount of EUV radiation power and visible radiation power minus the calculated amount of EUV radiation power). The power of IR radiation may be determined in a two-step process. The first step includes measuring the change in separation (D1−D) of the first measurement plate 71 and using knowledge of the material properties of the first measurement plate 71 to calculate the power absorbed by the first measurement plate 71. The second step includes calculating the difference between the amount of power absorbed by the first measurement plate 71 and the amount of power absorbed by the second measurement plate 72 (i.e. the calculated amount of EUV radiation power, visible radiation power and IR radiation power minus the calculated amount of EUV radiation power and visible radiation power). In the case of an LPP radiation source, some DUV radiation is expected to be present in the radiation beam. However, the amount of DUV radiation in the radiation beam is expected to be relatively small. For example, less than approximately 1% of the radiation beam is expected to comprise DUV radiation.

Figure 8B:
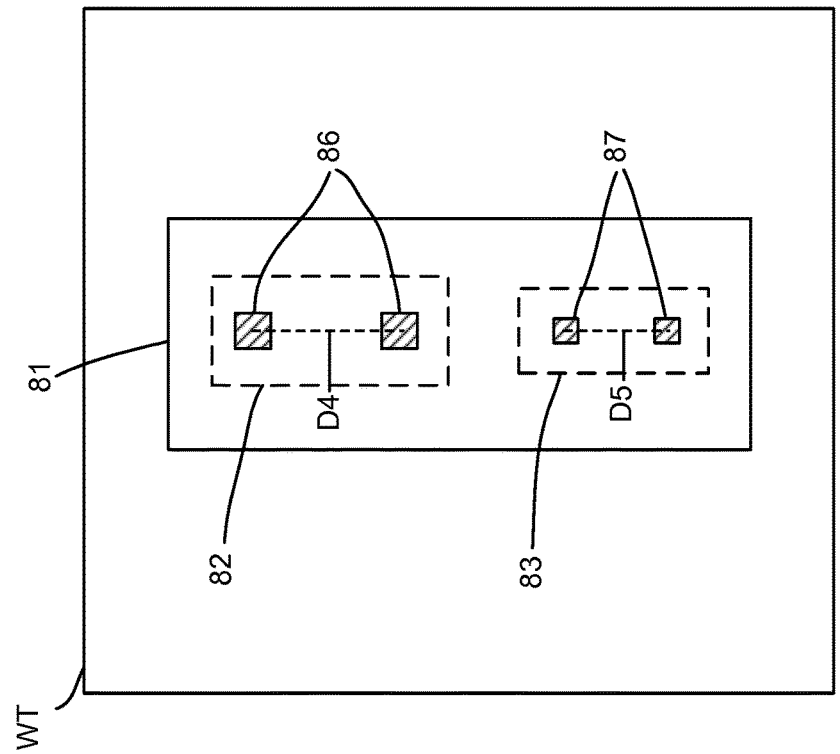
FIG. 8, consisting of FIG. 8A and FIG. 8B, schematically depicts a substrate table comprising a measurement plate which forms part of the radiation analysis system according to an embodiment of the invention.
Figure 8A:
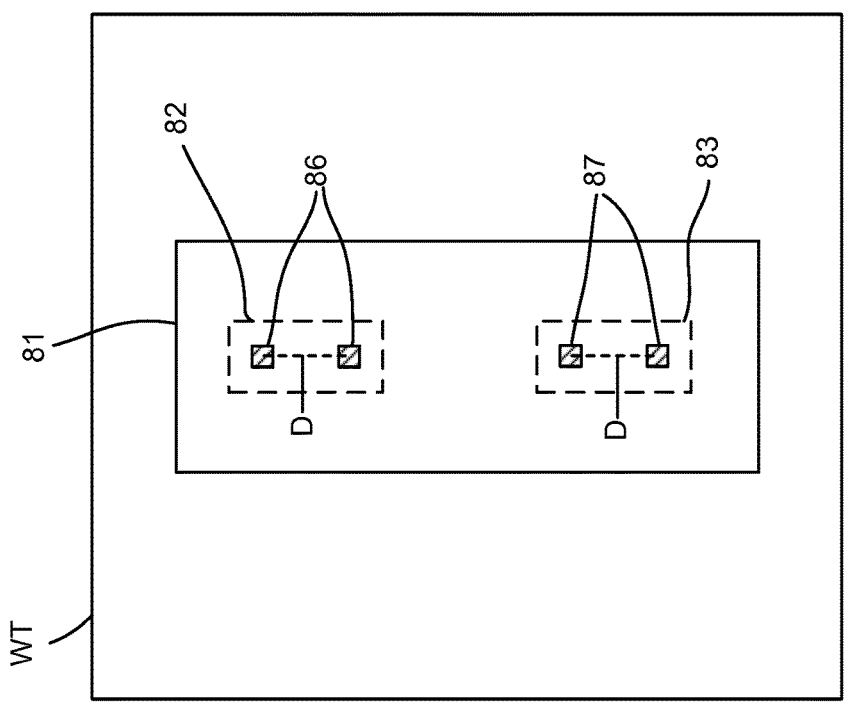

A coating having desired radiation absorption properties may be applied to a measurement plate in order to provide spectral filtering of the radiation beam. FIG. 8, consisting of FIG. 8A and FIG. 8B, schematically depicts a substrate table WT comprising a target 81 according to an embodiment of the invention. FIG. 8A depicts the target 81 before the target is exposed to the radiation beam. FIG. 8B depicts the target 81 after the target has been exposed to the radiation beam.

In the example of FIG. 8, the target 81 is a measurement plate. The measurement plate 81 comprises first and second coating areas 82, 83. The coating areas 82, 83 are thermally isolated from each other and from the rest of the measurement plate 81 such that a transfer of energy absorbed by the coating areas 82, 83 to other parts of the measurement plate 81 is limited. Using a measurement plate 81 having a small thickness, e.g. a thickness of approximately 0.1 mm, may reduce a transfer of energy between the coating areas 82, 83 and other parts of the measurement plate 81. The first coating area 82 comprises two marks 86 that are separated from each other by a distance D. The second coating area 83 comprises two marks 87 that are separated from each other by a distance D. The first coating area 82 may, for example, comprise a first coating that is configured to absorb EUV radiation and reflect IR radiation. The first coating may, for example, comprise aluminium. The second coating area 83 may, for example, comprise a second coating that is configured to absorb IR radiation and reflect EUV radiation. The second coating 83 may, for example, comprise $SiNO_2$ or NiP.

FIG. 8B shows that the separation D between the marks 86 in the first coating area 82 has increased to a larger separation D4 due to thermal expansion of the first coating area 82 caused by energy absorbed from EUV radiation present in the radiation beam. The separation D between the marks 87 in the second coating area 83 has increased to a larger separation D5 due to thermal expansion of the second coating area induced by energy absorbed from IR radiation present in the radiation beam. As may be seen on comparison between D4 and D5, the first coating area 82 has undergone a larger thermal expansion than the second coating area 83, indicating that the radiation beam comprised more EUV radiative power than IR radiative power. The amount of EUV radiative power and the amount of IR radiative power present in the radiation beam may be determined using the radiation analysis system RAS for each set of marks 86, 87 on each coating area 82, 83 as previously discussed.

The following is a detailed example of an embodiment of the invention in which the target comprises a coated measurement plate provided on the substrate table. The measurement plate may comprise an aluminium plate provided on the substrate table via flexures, such as leaf springs. The aluminium plate may, for example, have a length of 30 mm, a width of 10 mm and a thickness of 0.1 mm. In this example, the aluminium plate would have a weight of approximately 80 mg. Given the above characteristics of the aluminium plate, the temperature of the aluminium plate may increase by approximately 14 mK per mJ of energy that the aluminium plate absorbs from the radiation beam. The aluminium plate may comprise two marks that are separated from each other by a distance of, for example, approximately 26 mm. The separation of the marks on the measurement plate may increase by approximately 8 nm per mJ of energy absorbed from the radiation beam.

It may be assumed that there is a measurement uncertainty associated with the position measurement system of approximately 0.2 nm per mark (i.e. a 0.4 nm position measurement error for the relative change in separation for both marks). It may also be assumed that there is negligible heat transfer between the aluminium plate and its surroundings between a time at which the radiation beam is no longer on the measurement plate and a time at which a measurement of the change in separation of the marks takes place. Given the above assumptions, the measurement accuracy of the position measurement system may be approximately 0.01% per Joule of absorbed energy (i.e. 0.01% per Watt of absorbed power). Alternatively, a model may be used to correct for heat transfer between the aluminium plate and its surroundings between a time at which the aluminium plate is illuminated with radiation and a time at which a change in separation of the marks is measured.

Figure 9B:
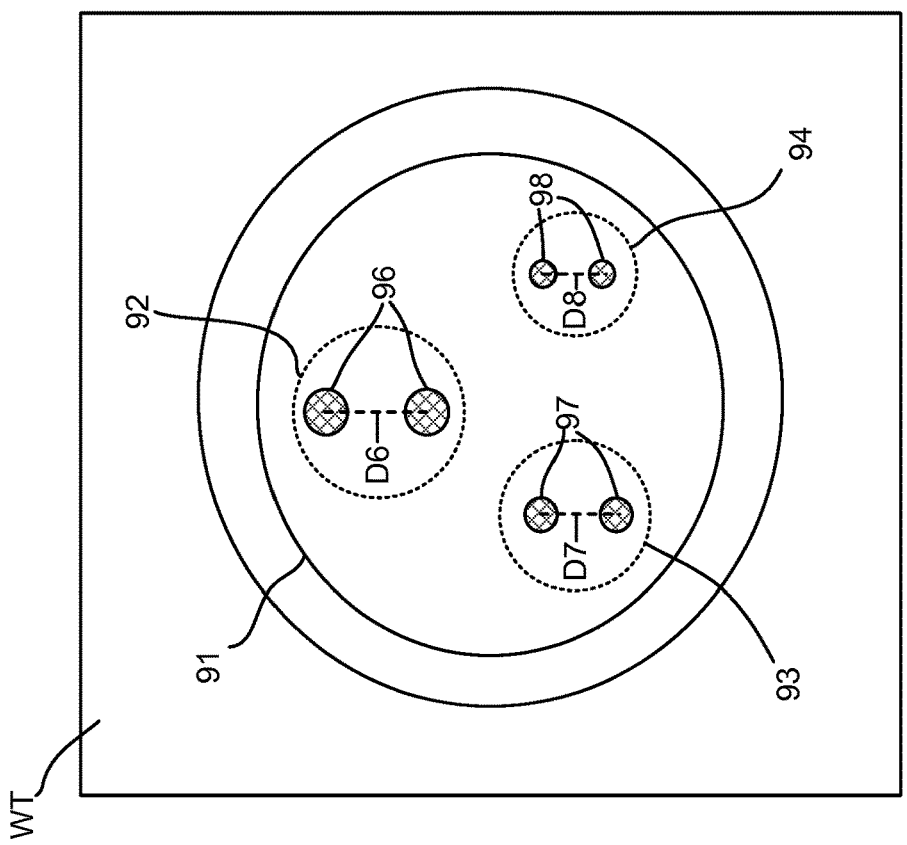
FIG. 9, consisting of FIG. 9A and FIG. 9B, schematically depicts a substrate mounted on a substrate table which forms part of the radiation analysis system according to an embodiment of the invention.
Figure 9A:
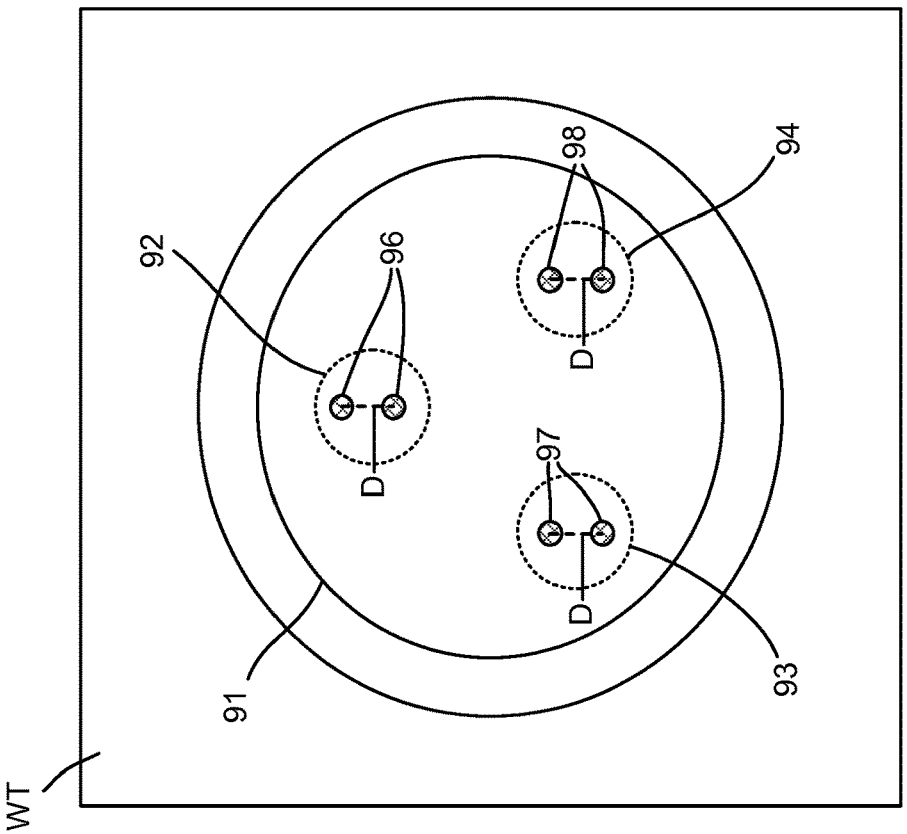

A measurement substrate that is suitable for use with the radiation analysis system RAS may comprise different materials having different radiation absorption properties and/or the measurement substrate may comprise different coatings having different radiation absorption properties. FIG. 9, consisting of FIG. 9A and FIG. 9B, schematically depicts a measurement substrate 91 mounted on a substrate table WT according to an embodiment of the invention. FIG. 9A depicts the measurement substrate 91 before the measurement substrate is exposed to a radiation beam. FIG. 9B depicts the measurement substrate 91 after the measurement substrate has been exposed to the radiation beam. Burls that support the measurement substrate 91 on the substrate table WT have been omitted from FIG. 9 for clarity.

In the example of FIG. 9, the measurement substrate 91 comprises three coating areas 92, 93, 94. The coating areas 92, 93, 94 are thermally isolated from each other and from the rest of the measurement substrate 91 such that a transfer of energy absorbed by the coating areas 92, 93, 94 to other parts of the measurement substrate 91 is limited. Thermal isolation of the coating areas 92, 93, 94 from other parts of the measurement substrate 91 may be achieved by using a measurement substrate having a small thickness (e.g. less than approximately 1 mm) and/or by having a substantial separation between the marks 92, 93, 94 (e.g. greater than approximately 10 mm). The first coating area 92 may, for example, comprise a first coating that is configured to absorb EUV radiation, visible radiation and IR radiation. The first coating may, for example, comprise SiNO or NiP. The second coating area 93 may, for example, comprise a second coating that is configured to absorb EUV radiation and IR radiation but not visible radiation. The second coating 93 may, for example, comprise $SiO_2$. The third coating area 94 may, for example, comprise a third coating that is configured to absorb EUV radiation but not visible radiation or IR radiation. The third coating may, for example, comprise aluminium.

Referring to FIG. 9A, the first, second and third coating areas 92, 93, 94 each comprise two marks 96, 97, 98 that are separated from each other by a distance D. In this embodiment the separation D is the same for each pair of marks (although in other embodiments the separation may be different for different pairs of marks). Referring to FIG. 9B, after the measurement substrate 91 has been exposed to radiation the separation between pairs of marks has increased. The separation between the marks 96 in the first coating area 92 has increased to a larger separation D6 due to thermal expansion of the first coating area 92 caused by energy absorbed from EUV radiation, visible radiation and IR radiation present in the radiation beam. The separation between the marks 97 in the second coating area 93 has increased to a larger separation D7 due to thermal expansion of the second coating area 93 caused by energy absorbed from EUV radiation and IR radiation present in the radiation beam. The separation between the marks 98 in the third coating area 94 has increased to a larger separation D8 due to thermal expansion of the third coating area 94 caused by energy absorbed from EUV radiation present in the radiation beam.

As can be seen on comparison between FIG. 9A and FIG. 9B, the first coating area 92 has undergone the largest thermal expansion, the second coating area 93 has undergone a smaller thermal expansion than the first coating area 92, and the third coating area 94 has undergone the smallest thermal expansion. The amount of EUV radiation power, visible radiation power and IR radiation power present in the radiation beam may be determined using the radiation analysis system RAS for each set of marks 96, 97, 98 on each coating area 92, 93, 94 as previously described. The results provided by the processor PR for each coating area 92, 93, 94 may then be compared with each other and used in calculations with each other in a manner similar to calculations discussed with reference to FIG. 7.

As depicted in FIG. 1, a lithographic apparatus LA may comprise multiple targets for use with the radiation analysis system RAS. Alternatively, a lithographic apparatus LA may comprise one target for use with the radiation analysis system RAS. Using a measurement substrate mounted on a substrate table as a target may be preferred over using a measurement plate provided on the substrate table because contemporary lithographic apparatus are configured to receive substrates, perform position measurements of marks on substrates and expose substrates to a radiation beam. Providing a measurement plate on the substrate table may require modification of contemporary substrate tables and/or other components of a lithographic apparatus. A measurement substrate may be input into a contemporary lithographic apparatus using a normal substrate handling process. A measurement substrate may therefore be input into contemporary lithographic apparatus with greater ease than a measurement plate. A measurement substrate in the lithographic apparatus may be easily exchanged for a different measurement substrate having different spectral absorption properties for different spectral analysis of the radiation beam. Exchanging a measurement plate in a lithographic apparatus for a different measurement plate having different spectral absorption properties may be more difficult to achieve because this may, for example, require removal of a substrate table and/or a support structure that the measurement plate is provided on.

The use of different materials and/or different coatings to provide spectral filtering of a radiation beam may also be used when the target is a modified mask comprising two marks that are separated from each other. That is, the mask may comprise one or more different areas that have different materials and/or different coatings that have different radiation absorption properties.

In general, the accuracy of the radiation analysis system RAS may be increased by the target absorbing as many photons of interest as possible that are present in the radiation beam. This may be achieved by having the entire radiation beam incident on a target that is capable of absorbing a majority of photons that are of interest and reflecting and/or transmitting a majority of photons that are not of interest. The accuracy of the radiation analysis system RAS may be increased by forming the target from a material that has a coefficient of thermal expansion that provides a significant increase in the separation between the two marks of the target per Joule of energy absorbed from the radiation beam. The target may preferably be formed of a material that has a specific heat capacity that provides a significant increase in temperature of the target per joule of energy absorbed from the radiation beam. Heat transfer between the target and its surroundings may preferably be limited such that there is a change in the separation between the two marks between a time at which the radiation beam is no longer incident on the target and a time at which the positions of the two marks are measured using the position measurement system is limited. The amount of time between a time at which the radiation beam is no longer incident on the target and a time at which the positions of the two marks are measured using the position measurement system may preferably be limited such that heat transfer between the target and its surroundings is limited. The accuracy of the radiation analysis system RAS may be increased by increasing the separation between the marks on the target such that a larger portion of the target is then able to thermally expand and contribute to the change in separation of the marks.

As mentioned earlier, the lithographic apparatus may be of a type having two (dual stage) or more substrate tables. In the case of a dual stage lithographic apparatus, the substrate region of the lithographic apparatus comprises a measurement stage and an exposure stage. Properties of one substrate are measured at the measurement stage whilst exposure of another substrate is taking place at the exposure stage. The position measurement system of a dual stage lithographic apparatus is typically present at the measurement stage whilst the radiation beam that is to be analysed by the radiation analysis system RAS is present at the exposure stage. Once the target at the exposure stage has been illuminated with radiation, the target may have to be moved to the measurement stage so that the position measurement system can measure the separation of the two marks. It may, for example, take approximately 2 seconds to move the target from the exposure stage to the measurement stage. The target may lose heat energy between the time at which the target is no longer illuminated with radiation and the time at which the target is measured by the position measurement system. The loss of heat energy during this time may negatively affect the accuracy of measurements made using the radiation analysis system RAS. It may be desirable to reduce the time between illuminating the target with radiation and measuring the target with the position measurement system to reduce the negative affect on the accuracy of the measurement caused by the loss of heat from the target. It may be preferable to have the target of the radiation analysis system RAS located at a patterning device (e.g. mask MA) region of a dual stage lithographic apparatus LA because the target does not need to be moved between the time at which the target is illuminated with radiation and the time at which the target is measured by the position measurement system.

Figure 10:
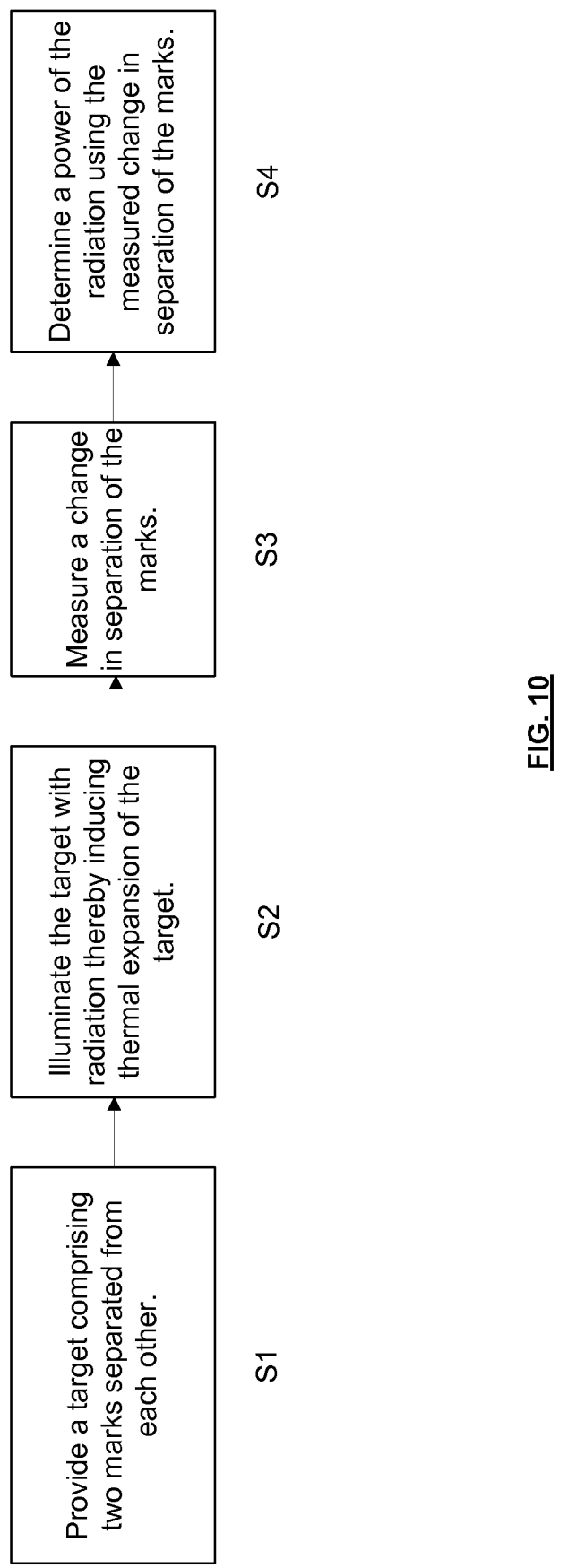
FIG. 10 shows a method of determining a power of radiation according to an embodiment of the invention.

FIG. 10 shows a method of determining a power of radiation according to an embodiment of the invention. In step S1, a target comprising two marks that are separated from each other is provided. In step S2, the target is illuminated with radiation, thereby inducing thermal expansion of the target. In step S3, a change in the separation of the marks is measured. For example, a contemporary position measurement system used in lithographic apparatus may be used to measure the change in separation of the marks. For example, the Smart Alignment Sensor Hybrid (or SMASH) is an example of a contemporary position measurement system that may form part of the radiation analysis system. Information relating to SMASH may be found in U.S. Pat. No. 6,961,116. It is to be understood that the present invention is not limited to use with the SMASH position measurement system. Other position measurement systems may be used. For example, the position measurement system may be of the type described in U.S. Pat. No. 6,297,876 (otherwise known as Advanced Technology using High order Enhancement of Alignment, or ATHENA). As a further example, the position measurement system may utilize the well-known "Through The Lens (TTL)" position measurement technique in which radiation diffracted by an alignment mark is formed on a detector grating to produce a periodic alignment signal which may be used with the present invention. It will be apparent to the skilled person that other (optical) arrangements may be used to obtain the same result of illuminating two marks on a target, detecting resulting radiation and determining a separation between the marks therefrom.

In step S4, a power of the radiation is determined using the measured change in the separation of the marks. Determining the power of the radiation involves calculating the amount of energy absorbed by the target from the radiation given how much the target has thermally expanded. Assumptions relating to material properties of the target, radiation absorption properties of the target, heating and/or cooling effects acting on the target, may be used in the calculations.

In general, the radiation analysis system RAS may comprise a target and an associated position measurement system that are located at a patterning device region of a lithographic apparatus and/or a substrate region of a lithographic apparatus. The term "patterning device region" is intended to indicate a portion of a lithographic apparatus that is between the illumination system IL and the projection system PS. The target may be provided on a patterning device (e.g. mask MA) and/or a support structure MT of the patterning device in a lithographic apparatus. The term "substrate region" is intended to indicate a portion of a lithographic apparatus that is downstream of the projection system PS. The target may be provided on a substrate W and/or a substrate table WT in a lithographic apparatus. Alternatively, the position measurement system may be offset from the projection system PS, e.g. in the case of a dual stage lithographic apparatus, in which case the position measurement system is still considered to be within a substrate region of the lithographic apparatus.

The target may take the form of a measurement plate, a substrate and/or a patterning device. In general, the marks on the target may be separated from each other by a distance in the range of approximately 20 mm to 110 mm. The target may have a coefficient of thermal expansion within the inclusive range of 2 ppm $K^{-1}$ to 30 ppm $K^{-1}$. The target may have a specific heat capacity within the inclusive range of 1 J $cm^{-3}$ $K^{-1}$ to 3 J $cm^{-3}$ $K^{-1}$. The target may have a thickness within the inclusive range of 0.1 mm to 1.0 mm. The target may have a thickness in the range of approximately 0.1 mm to approximately 1.0 mm.

In general, the target may comprise materials such as, for example, aluminium, steel, $SiNO_2$, silicon, zirconium, etc. The target may comprise a coating. In general, the coating may, for example, comprise aluminium, silicon, $SiO_2$, NiP, etc. The target may be thermally isolated from its surroundings such that the majority of energy absorbed by the target form the radiation beam induces thermal expansion of the target rather than being lost to the target's surroundings. The target may be illuminated with radiation until a temperature of the target has increased by approximately 1 K to 10 K. A cooling of the target may be interrupted when the radiation analysis system is in use so as to reduce heat transfer between the target and its surroundings when radiation is to be analyzed by the radiation analysis system RAS.

The separation between the marks is known at a known temperature. That is, an initial temperature of the target is known before the target is illuminated with radiation and undergoes thermal expansion. The initial temperature of the target may be measured by one or more temperature sensors before the radiation analysis system illuminates the target with radiation. Alternatively, the initial temperature of the target may be determined from knowledge of a temperature of the target's surroundings. For example, the initial temperature of the target may be the same as an ambient temperature of a lithographic apparatus in which the target is situated. The ambient temperature of the lithographic apparatus may be controlled by, for example, flowing a cooling fluid such as water through a cooling system of the lithographic apparatus. The ambient temperature of the lithographic apparatus may remain substantially stable during normal operating conditions of the lithographic apparatus. The ambient temperature of the lithographic apparatus may, for example, be approximately 21° C.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO. Alternatively, the radiation source SO may, for example, comprise a free electron laser (FEL).

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation analysis system comprising:
a target comprising two marks which are separated from each other, the target being configured to undergo thermal expansion when illuminated with radiation;
a position measurement system configured to measure a change in the separation of the marks; and
a processor configured to determine a power of the radiation using the measured change in separation of the marks.

2. The radiation analysis system of claim 1, wherein the target is thermally isolated from its surroundings.

3. The radiation analysis system of claim 1, wherein the target is in a vacuum environment.

4. The radiation analysis system of claim 1, wherein the target comprises a measurement plate.

5. The radiation analysis system of claim 4, wherein the measurement plate comprises a metal or a semiconductor.

6. The radiation analysis system of claim 1, wherein the target is one of multiple targets having different radiation absorption properties.

7. The radiation analysis system of claim 6, wherein different targets comprise different coatings having different radiation absorption properties.

8. The radiation analysis system of claim 1, wherein the separation between the marks is between approximately 20 mm and 110 mm.

9. The radiation analysis system of claim 1, wherein a coefficient of thermal expansion of the target is between approximately 2 ppm K-1 to 30 ppm K-1.

10. The radiation analysis system of claim 1, wherein a specific heat capacity of the target is between approximately 1 J cm-3K-1 to 3 J cm-3K-1.

11. The radiation analysis system of claim 1, wherein a thickness of the target is between approximately 0.1 mm to 1.0 mm.

12. The radiation analysis system of claim 1, wherein the radiation analysis system forms part of a lithographic apparatus, the lithographic apparatus comprising:
an illumination system configured to condition a radiation beam;
a support structure constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto the substrate, wherein the radiation analysis system is configured to analyze the radiation beam.

13. The radiation analysis system of claim 12, wherein the target is a measurement substrate.

14. The radiation analysis system of claim 13, wherein the measurement substrate is mounted on the substrate table and supported by burls, the burls forming a burl area across the measurement substrate, wherein the marks are located outside of the burl area.

15. The radiation analysis system of claim 13, wherein the measurement substrate is mounted on the substrate table and supported by burls, the burls forming a burl area across the measurement substrate, wherein the marks are located within the burl area and the separation of the marks is less than a pitch of the burls.

16. The radiation analysis system of claim 12, wherein the patterning device comprises the target.

17. The radiation analysis system of claim 12, wherein the target is a measurement plate mounted on the support structure via flexures.

18. The radiation analysis system of claim 12 wherein the target is a measurement plate mounted on the substrate table via flexures.

19. The radiation analysis system of claim 17, wherein the flexures comprise leaf springs.

20. A method of analyzing radiation, the method comprising:
illuminating a target, the target comprising two marks separated from each other, the illuminating inducing thermal expansion of the target;
measuring a change in the separation of the marks; and
determining a power of the radiation using the measured change in separation of the marks.

21. The method of claim 20, wherein the target is thermally isolated from its surroundings.

22. The method of claim 20, wherein:
multiple targets are provided, and
the multiple targets have different radiation absorption properties.

23. The method of 20, wherein the target is illuminated with radiation until a temperature of the target has increased by a value between approximately 1K to 10K.

24. The method of claim 20, wherein heating and/or cooling effects acting on the target that are not due to the radiation are modeled and accounted for when determining the power of the radiation.

25. The method of claim 20, wherein a coefficient of thermal expansion of the target is between approximately 2 ppm K-1 to 30 ppm K-1.

26. The method of claim 20, wherein a specific heat capacity of the target is between approximately 1 J cm-3K-1 to 3 J cm-3K-1.

27. The method of claim 20, wherein a thickness of the target is between approximately 0.1 mm to 1.0 mm.

28. The method of claim 20, wherein a delay between a time at which the target is no longer illuminated with radiation and a time at which the change in separation of the marks is measured is between approximately 0.5 seconds to 5.0 seconds.

29. The method of claim 20, wherein a cooling of the target is interrupted when the radiation analysis system is in use.

30. A computer readable medium for storing computer readable code wherein the code causes a lithographic apparatus to perform the method of analyzing radiation, the method comprising:

illuminating a target, the target comprising two marks separated from each other, the illuminating induces thermal expansion of the target;

measuring a change in the separation of the marks; and determining a power of the radiation using the measured change in separation of the marks.

\* \* \* \* \*